United States Patent
Tsai et al.

(10) Patent No.: US 10,879,290 B2
(45) Date of Patent: *Dec. 29, 2020

(54) PROTECTION RING FOR IMAGE SENSORS

(71) Applicant: Taiwan Semiconductor Manufacturing Co., Ltd., Hsin-Chu (TW)

(72) Inventors: Tsung-Han Tsai, Zhunan Township (TW); Chun-Hao Chou, Tainan (TW); Kuo-Cheng Lee, Tainan (TW); Yung-Lung Hsu, Tainan (TW); Yun-Wei Cheng, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/695,429

(22) Filed: Nov. 26, 2019

(65) Prior Publication Data

US 2020/0098799 A1 Mar. 26, 2020

Related U.S. Application Data

(60) Continuation of application No. 16/386,665, filed on Apr. 17, 2019, now Pat. No. 10,546,890, which is a
(Continued)

(51) Int. Cl.
*H01L 27/146* (2006.01)
*H01L 21/761* (2006.01)
*H01L 23/58* (2006.01)

(52) U.S. Cl.
CPC ........ *H01L 27/1463* (2013.01); *H01L 21/761* (2013.01); *H01L 23/58* (2013.01);
(Continued)

(58) Field of Classification Search
None
See application file for complete search history.

(56) References Cited

U.S. PATENT DOCUMENTS 5,367,188 A * 11/1994 Kudo ................ H01L 27/14643
257/461
7,135,750 B1 11/2006 Beckman et al.
(Continued)

FOREIGN PATENT DOCUMENTS

KR 100766497 B1 10/2007

OTHER PUBLICATIONS

Notice of Allowance dated Oct. 12, 2016 for U.S. Appl. No. 14/645,751, filed Mar. 12, 2015.
(Continued)

*Primary Examiner* — Ali Naraghi
(74) *Attorney, Agent, or Firm* — Eschweiler & Potashnik, LLC

(57) ABSTRACT

Some embodiments relate to a device array including a plurality of devices arranged in a semiconductor substrate. A protection ring circumscribes an outer perimeter of the device array. The protection ring includes a first ring neighboring the device array, a second ring circumscribing the first ring and meeting the first ring at a first p-n junction, and a third ring circumscribing the second ring and meeting the second ring at a second p-n junction. The first ring has a first width, the second ring has a second width, and the third ring has a third width. At least two of the first width, the second width, and the third width are different from one another.

20 Claims, 9 Drawing Sheets

Related U.S. Application Data continuation of application No. 15/904,734, filed on Feb. 26, 2018, now Pat. No. 10,276,617, which is a continuation of application No. 15/413,688, filed on Jan. 24, 2017, now Pat. No. 9,905,601, which is a division of application No. 14/645,751, filed on Mar. 12, 2015, now Pat. No. 9,613,916.

(52) U.S. Cl.
CPC .... *H01L 27/1464* (2013.01); *H01L 27/14607* (2013.01); *H01L 27/14609* (2013.01); *H01L 27/14621* (2013.01); *H01L 27/14627* (2013.01); *H01L 27/14643* (2013.01); *H01L 27/14683* (2013.01); *H01L 27/14687* (2013.01); *H01L 27/14689* (2013.01)

(56) References Cited

U.S. PATENT DOCUMENTS

| | | | |
|---|---|---|---|
| 7,202,899 B2* | 4/2007 | Lin | H01L 27/14603 257/291 |
| 7,713,809 B2 | 5/2010 | Rhodes et al. | |
| 7,821,046 B2 | 10/2010 | Brady | |
| 8,125,042 B2 | 2/2012 | Kim et al. | |
| 9,443,774 B2 | 9/2016 | Mizushima et al. | |
| 10,276,617 B2 | 4/2019 | Tsai et al. | |
| 2002/0148967 A1 | 10/2002 | Iwanczyk et al. | |
| 2006/0086991 A1 | 4/2006 | Barthelmess et al. | |
| 2006/0255372 A1* | 11/2006 | Patrick | H01L 27/14609 257/225 |
| 2008/0265295 A1* | 10/2008 | Brady | H01L 27/1463 257/291 |
| 2009/0261392 A1 | 10/2009 | Tatani | |
| 2013/0153962 A1 | 6/2013 | Sim et al. | |
| 2015/0171133 A1 | 6/2015 | Kim et al. | |

OTHER PUBLICATIONS

Non-Final Office Action dated Aug. 3, 2017 for U.S. Appl. No. 15/413,688.
Notice of Allowance dated Oct. 13, 2017 for U.S. Appl. No. 15/413,688.
Non-Final Office Action dated Jul. 2, 2018 for U.S. Appl. No. 15/904,734.
Notice of Allowance dated Mar. 1, 2019 for U.S. Appl. No. 15/904,734.
Non-Final Office Action dated Jun. 27, 2019 for U.S. Appl. No. 16/386,665.
Notice of Allowance dated Oct. 17, 2019 for U.S. Appl. No. 16/386,665.

\* cited by examiner

PROTECTION RING FOR IMAGE SENSORS

REFERENCE TO RELATED APPLICATIONS

This Application is a Continuation of U.S. application Ser. No. 16/386,665, filed on Apr. 17, 2019, which is a Continuation of U.S. application Ser. No. 15/904,734, filed on Feb. 26, 2018 (now U.S. Pat. No. 10,276,617, issued on Apr. 30, 2019), which is a Continuation of U.S. application Ser. No. 15/413,688, filed on Jan. 24, 2017 (now U.S. Pat. No. 9,905,601, issued on Feb. 27, 2018), which is a Divisional of U.S. application Ser. No. 14/645,751, filed on Mar. 12, 2015 (now U.S. Pat. No. 9,613,916, issued on Apr. 4, 2017). The contents of the above-referenced Patent Applications are hereby incorporated by reference in their entirety.

BACKGROUND

Digital cameras and optical imaging devices employ image sensors. Image sensors convert optical images to digital data that may be displayed as digital images. An image sensor includes an array of photosensors, which are unit devices for the conversion of an optical image into digital data. Photosensors often manifest as charge-coupled devices (CCDs) or complementary metal oxide semiconductor (CMOS) devices. However, CMOS photosensors have recently received more attention. Relative to CCD photosensors, CMOS photosensors provide lower power consumption, smaller size, and faster data processing. Further, CMOS photosensors provide a direct digital output of data, and generally have a lower manufacturing cost compared with CCD photosensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
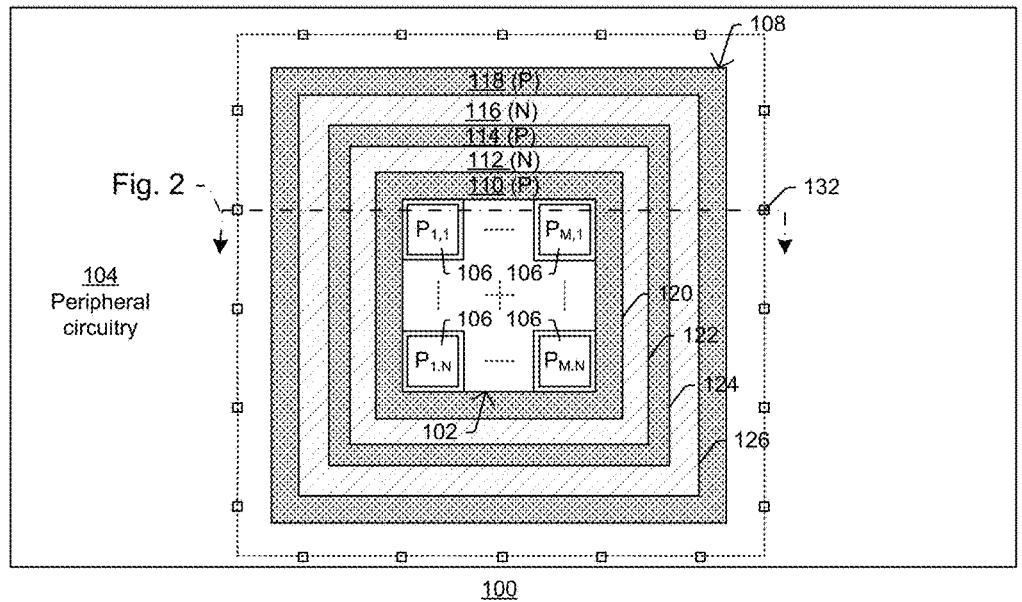
FIG. 1 illustrates a top view of some embodiments of an image sensor employing a protection ring made up of a series of alternating concentric p-n regions.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices, such as cameras, cellular telephones, personal digital assistants (PDAs), MP3 players, computers and other devices, include an image sensor for capturing images. One example of such an image sensor is a complementary metal-oxide semiconductor (CMOS) image sensor 100 illustrated in FIG. 1, which may also be referred to as a "CIS". Image sensor 100 is disposed on a semiconductor substrate, and includes a pixel sensor array 102 which is surrounded by peripheral circuitry 104. Peripheral circuitry 104 may include a logic circuit to support operation of the of the pixel sensor array 102, and can include transistors, capacitors, resistors, inductors, and/or diodes, for example. The pixel sensor array 102 typically includes individual photosensors 106, which are arranged in a series of M columns and N rows, wherein M and N are positive integers. In FIG. 1's example, the individual photosensors 106, which can include respective photodiodes therein, have been labeled $P_{column}$, $P_{row}$ for clarity, and it will be appreciated that M and N can be equal or non-equal, depending on the implementation. For example, $P_{1,1}$ represents a photosensor at an intersection of the first column and first row, and $P_{M,N}$ represents a photosensor at an intersection of the $M^{th}$ column and $N^{th}$ row.

Increasingly, individual photosensors 106 are being scaled down to reduce pixel pitch (i.e., the distance between neighboring pixels) to sub-micrometer dimensions (e.g., less than 0.75 micrometers), and the photosensors near the edge of the pixel sensor array 102 are being spaced closer to the surrounding peripheral circuitry 104. At such dimensions, charge build-up during manufacture can become an issue. In some embodiments, during manufacture of the image sensor 100, dry etching (e.g., reactive ion etching (RIE)) can cause excess charge to accumulate on gates of the peripheral circuitry 104 which are nearest to edges of the pixel sensor array 102 or on substrate grounding contacts 132 through which the substrate on which image sensor 100 is arranged is grounded. If sufficient charge levels are attained, the pent up charge could potentially release in a sudden and intense discharge, for example by arcing to individual photosensors 106 on outer edges of the pixel sensor array 102. This discharge could catastrophically damage the individual photosensors on edges of the pixel sensor array 102, possibly causing them to manifest as "white pixels" which report little or no useful image data during operation.

In view of the foregoing, the present disclosure employs a protection ring 108 separating the pixel sensor array 102 from the surrounding peripheral circuitry 104 and/or from substrate grounding contacts 132. This protection ring 108 is made up of a series of concentric rings which have alternating conductivity types and which circumscribe an outer perimeter of the pixel sensor array 102. For example, the protection ring 108 can include a first (e.g., innermost) ring 110, which has a first conductivity type; a second ring 112 surrounding the first ring 110 and having a second conductivity type; a third ring 114 surrounding the second ring 112 and having the first conductivity type; a fourth ring 116 surrounding the third ring 114 and having the second conductivity type; and a fifth (e.g., outermost) ring 118 surrounding the fourth ring 116 and having the first conductivity type. In the illustrated embodiment of FIG. 1, the first conductivity type is illustrated as being p-type and the second conductivity type is illustrated as being n-type, although the first and second conductivity types could be flipped in other implementations. The alternating conductivities of these rings collectively establish a series of p-n junctions that impede pent-up charge from discharging to the photosensors 106. For example, the first and second rings 110, 112 can meet at a first p-n junction 120, and the second and third rings 112, 114 can meet at a second p-n junction 122. The third and fourth rings 114, 116 can meet at a third p-n junction 124, and the fourth and fifth rings 116, 118 meet at a fourth p-n junction 126. Thus, these rings 110-118 and their corresponding p-n junctions reduce the occurrence of white pixels and provide image sensors with better image sensing functionality.

Figure 2:
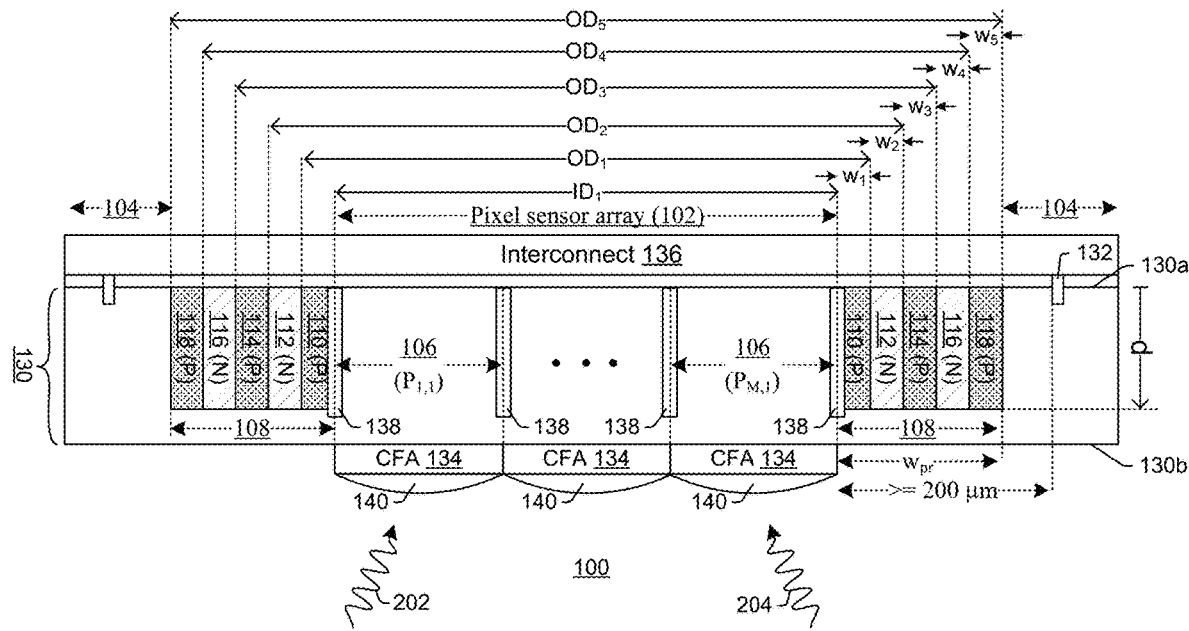
FIG. 2 illustrates a cross-sectional view FIG. 1's image sensor.

As shown in FIG. 2's cross-sectional view of the image sensor 100, the protection ring 108 and other structures are disposed in or on a semiconductor substrate 130. The semiconductor substrate 130 can manifest as a semiconductor on insulator (SOI) substrate or a bulk substrate of silicon, germanium, or group III and group V elements, for example. A color filter array (CFA) 134 may optionally be present on a backside 130b of the semiconductor substrate 130, and an interconnect structure 136, which is often made up of alternating conductive and insulating layers and may include gates, wires, vias, and contacts, is arranged over an upper substrate surface 130a and can route signals among the photosensors 106 and/or peripheral circuitry 104 and/or therebetween. A micro-lens array 140 may also be present in some implementations and help to steer impingent photons (e.g., 202, 204) towards their corresponding pixel sensors (e.g., $P_{1,1}$, $P_{M,1}$, respectively).

As shown, the protection ring 108 includes concentric rings 110-118, which have respective outer diameters $OD_1$-$OD_5$, respectively. Although the term "diameter" is used herein, this term does not necessarily invoke an interpretation where the rings are circular, but can relate to squares, rectangles and other geometries that are still ring-like. Again, first ring 110 neighbors the pixel sensor array 102, second ring 112 circumscribes first ring 110, third ring 114 circumscribes second ring 112, fourth ring 116 circumscribes third ring 114, and fifth ring 118 circumscribes fourth ring 116. In some embodiments, the uppermost extents of these rings 100-118 are proximate to an upper substrate surface 130a, and can, for example abut the upper substrate surface 130a. The rings 110-118 extend continuously around the outer perimeter of the pixel sensor array 102, typically without any breaks; and typically the dopants of the respective rings do not extend into the individual photosensors 106. Isolation structures 138, such as dielectric material arranged in trenches extending downward from the upper substrate surface 130a, can separate individual photosensors 106 from one another to reduce cross-talk and noise therebetween.

The total annular width, $w_{pr}$, of the protection ring 108 is measured between an inner diameter (ID) of the innermost ring (e.g., $ID_1$) and an outer diameter (OD) of the outermost ring (e.g., $OD_5$). This total annular width, $w_{pr}$, can vary widely, but in some embodiments is greater than 200 mircometers (μm); and/or ranges from greater than 20 μm to approximately 300 μm, and/or is between 50 μm and 100 μm in some embodiments. In general, an increase in the annular width, $w_{pr}$, of the protection ring 108 provides a corresponding increase in protection against potentially damaging discharge, but also costs more to manufacture due to increased area/footprint. In the illustrated embodiment of FIG. 2, the individual rings 110-118 are shown having widths $w_1$-$w_5$, respectively, which are equal or substantially equal to one another. In some embodiments, each of these widths $w_1$-$w_5$ range from approximately 10 nm to approximately 1000 μm, or from approximately 10 nm to approximately 500 μm. As will be appreciated further below, however, the widths of the individual rings 110-118 do not need to be equal, and can differ from one another in other implementations.

The doping concentrations of the respective rings 110-118 can also take different forms depending on the implementation. In some embodiments, the first ring 110 can exhibit a p-type dopant concentration ranging from approximately $1*10^{11}/cm^3$ to approximately $1*10^{13}/cm^3$; the second ring 112 can exhibit an n-type dopant concentration ranging from approximately $1*10^{11}/m^3$ to approximately $1*10^{13}/cm^3$; the third ring 114 can exhibit a p-type dopant concentration ranging from approximately $1*10^{11}/m^3$ to approximately $1*10^{13}/cm^3$; the fourth ring 116 can exhibit an n-type dopant concentration ranging from approximately $1*10^{11}/cm^3$ to approximately $1*10^{13}/cm^3$; and the fifth ring 118 can exhibit a p-type dopant concentration ranging from approximately $1*10^{11}/cm^3$ to approximately $1*10^{13}/cm^3$. In some embodiments, the rings 110-118 can have the same or substantially the same doping concentrations as one another; however in other embodiments the doping concentrations can be graded. For example, the doping concentrations of the respective rings can increase (e.g., monotonically and/or incrementally) from one ring to the next as one moves from the innermost ring to the outermost ring; or alternatively the doping concentrations of the respective rings can decrease (e.g., monotonically and/or incrementally) from one ring to the next as one moves from the innermost ring to the outermost ring. In still other embodiments, the doping concentration of respective rings could rise and fall between successive rings as one moves from the innermost ring to the outermost ring.

The depths of the respective rings 110-118 can also take different forms depending on the implementation. In some embodiments, a depth, d, of one or more of rings 110-118 ranges from approximately 0.2 μm to approximately 5 μm.

In some embodiments, the rings 110-118 can have the same or substantially the same depths as one another; however in other embodiments the depths can be graded. For example, the depths of the respective rings can increase (e.g., monotonically and/or incrementally) from one ring to the next as one moves from the innermost ring to the outermost ring; or alternatively the depths of the respective rings can decrease (e.g., monotonically and/or incrementally) from one ring to the next as one moves from the innermost ring to the outermost ring. In still other embodiments, the depths of respective rings could rise and fall between successive rings as one moves from the innermost ring to the outermost ring. Thus, in embodiments where the rings are formed on a 300 mm wafer having a thickness of about 775 µm (or in embodiments where the rings are formed on a 450 mm wafer having a thickness of about 925 µm), the depth of the rings can be less than 1% of the total thickness of Si for the substrate.

FIGS. 3-6 show some example top views of various arrangements of protection rings in accordance with some embodiments. In some embodiments, these rings show some non-limiting examples of protection rings with different widths which provide some different tradeoffs between discharge protection and cost.

Figure 3:
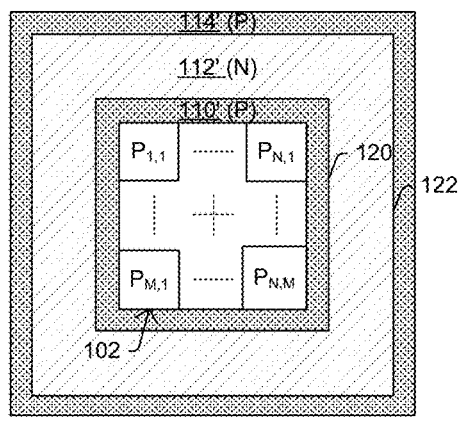
FIGS. 3-6 illustrate some example top views of alternate embodiments of image sensors employing protection rings.

In FIG. 3, which includes only three rings 110'-114', the first ring 110' has a first width as measured from the outer perimeter of the pixel sensor array 102 to the first p-n junction 120, and the second ring 112' has a second width as measured between from the first p-n junction 120 to the second p-n junction 122. The second width is greater than the first width. The third ring 114' has a third width as measured from the second p-n junction 122 to an outer diameter of the third ring, and the third width is illustrated as being equal or substantially equal to the first width. In some embodiments, the second width is at least approximately two times larger than the first width, but can be much larger (e.g., orders of magnitude larger than the first width). In some embodiments, the ratio of the first width:second width:third width is approximately 1:4:1. Having the second width be larger than the first and/or third widths helps to increase discharge protection.

Figure 4:
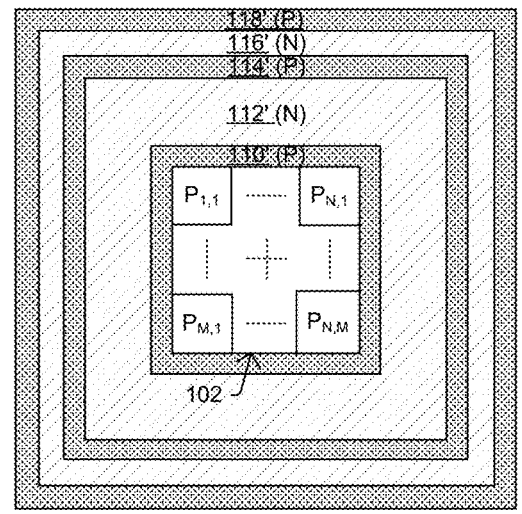

FIG. 4 is similar to FIG. 3, except that in FIG. 4 fourth and fifth rings 116', 118' have also been added to provide further isolation between the pixel sensor array 102 and peripheral circuitry 104 (not shown, but arranged outside of the fifth ring 118'). In FIG. 4, the fourth and fifth rings 116', 118' have the same width as the first and third rings 110', 114'. Thus, in some embodiments, the ratio of the first width:second width:third width:fourth width:fifth width is approximately 1:4:1:1:1.

Figure 5:
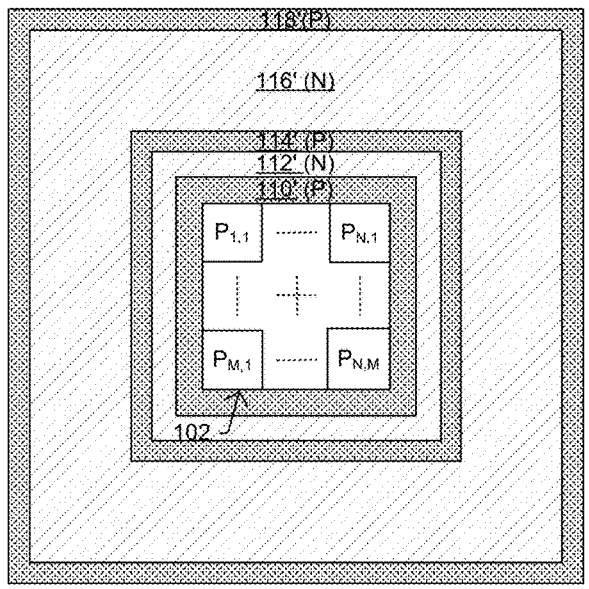

FIG. 5 shows another embodiment where the fourth ring 116' has a larger width than the other rings. In some embodiments, the fourth width is at least approximately two times larger than the first width, but can be much larger (e.g., orders of magnitude larger than the first width). Thus, in some embodiments, the ratio of the first width:second width: third width:fourth width:fifth width is approximately 1:1:1: 4:1.

Figure 6:
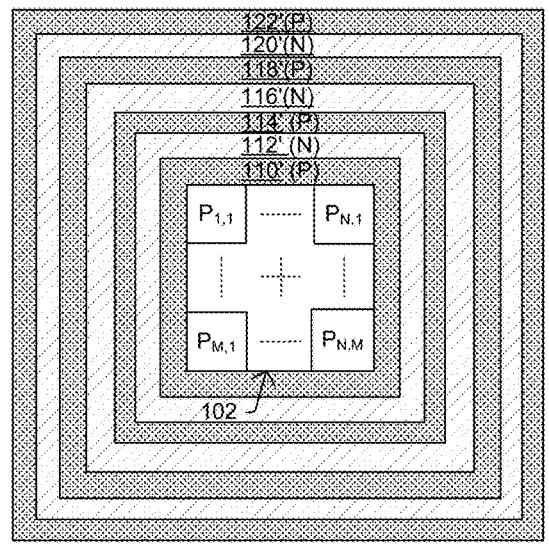
Figure 7:
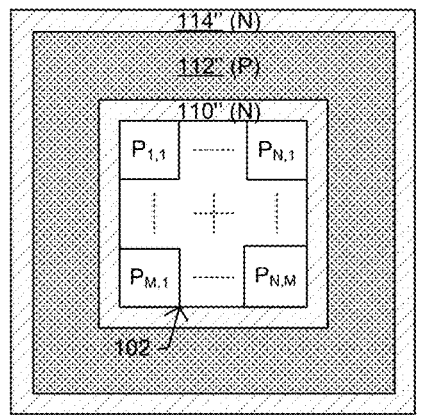
FIGS. 7-10 illustrate some further example top views of alternate embodiments of image sensors employing protection rings.
Figure 8:
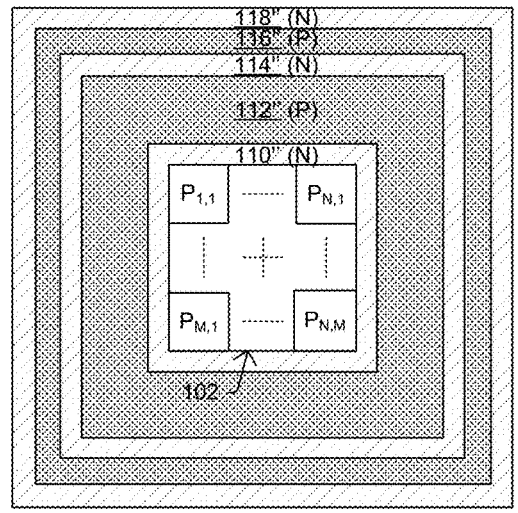
Figure 9:
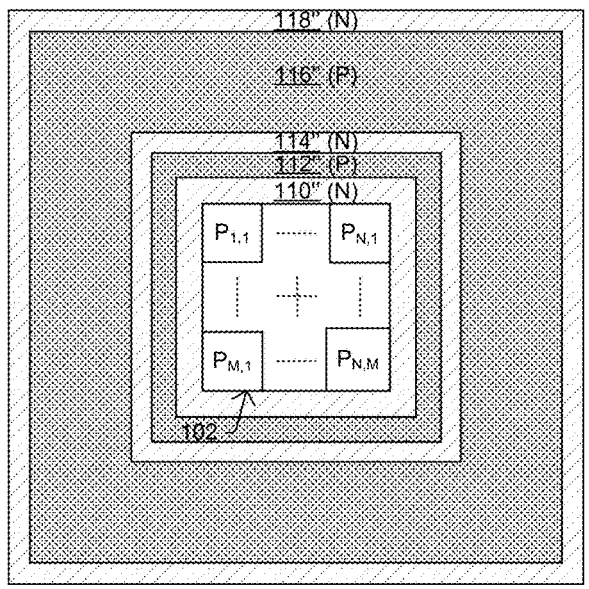
Figure 10:
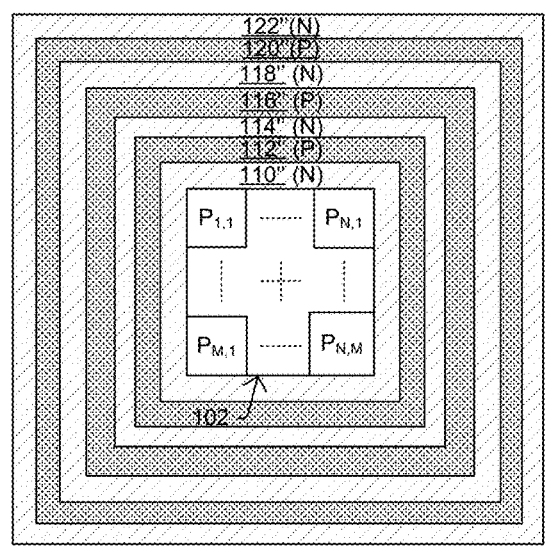

FIG. 6 shows an example where additional rings—namely a sixth ring 120' and a seventh ring 122'—are present. It will be appreciated that any number of rings can be present, ranging from three rings to a very large number or rings.

FIGS. 7-10 show some examples of various arrangements of protection rings, which correspond generally to FIGS. 3-6, but where the conductivity types of the rings have been flipped relative to FIGS. 3-6. It will be appreciated that the embodiments illustrated in FIGS. 3-6 may exhibit better performance than those of FIGS. 7-10 due to the fact that electrons have higher mobility than holes, but that both conductivity arrangements are contemplated as falling within the scope of this disclosure. Further, although protection rings are illustrated as square in the figures of this disclosure, protection rings in other un-illustrated embodiments could also be rectangular or exhibit other polygonal shapes. Further, protection rings in still other embodiments could also be circular and/or have rounded corners. Circular and/or rounded rings may be more difficult to manufacture, but may help provide smooth e-fields and thereby reduce hot carrier effects to provide good protection against sudden discharge.

Figure 11:
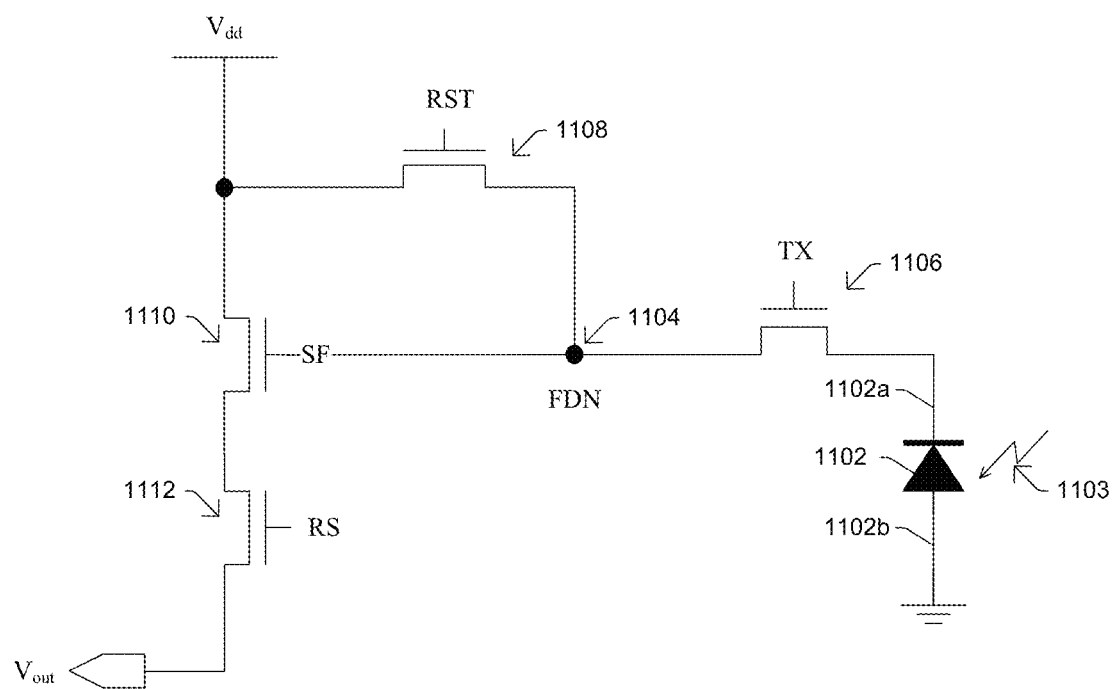
FIG. 11 illustrates a circuit diagram of some embodiments of a photosensors of an image sensor in accordance with some embodiments.

With reference to FIG. 11, a circuit diagram of some embodiments of a pixel sensor 1100, such as a photosensor 106 of FIG. 1, is provided. The pixel sensor 1100 includes a photodiode 1102, which can be implemented as pn junction photodiode or a pn junction photodiode with an insulator at the p-n junction interface (PIN junction photodiode). When a photon 1103 of sufficient energy strikes the photodiode 1102, an electron-hole pair is created. If absorption occurs in the junction's depletion region, or one diffusion length away from it, the carriers of this electron-hole pair are swept from the junction by the built-in electric field of the depletion region. Thus holes move toward an anode region 1102a of the photodiode 1102 and electrons toward a cathode region 1102b of the photodiode 1102, and a photocurrent is produced. The total current through the photodiode 1102 is the sum of the dark current (current that is generated in the absence of light) and the photocurrent. The photodiode 1102 is electrically connected to a floating diffusion node (FDN) 1104 by way of a transfer transistor (TX) 1106. The transfer transistor 1106 selectively transfers charge from the photodiode 1102 to the FDN 1104. A reset transistor 1108 is electrically connected between a DC voltage supply terminal $V_{dd}$ and the FDN 1104 to selectively clear charge at the FDN 1104. A source follower transistor 1110 is electrically connected between $V_{dd}$ and an output $V_{out}$, and is gated by the FDN 1104, to allow the charge level at the FDN 1104 to be observed without removing the charge. A row select transistor 1112 is electrically connected between the source follower transistor 1110 and the output $V_{out}$ to selectively output a voltage proportional to the charge at the FDN 1104.

During use, the pixel sensor 1100 is exposed to an optical image for a predetermined integration period. Over this period of time, the pixel sensor records the intensity of light incident on the photodiode 1102 by accumulating charge proportional to the light intensity. After the predetermined integration period, the amount of accumulated charge is read. In some embodiments the amount of accumulated charge for the photodiode 1102 is read by momentarily activating the reset transistor 1108 to clear the charge stored at the FDN 1104. Thereafter, the row select transistor 1112 is activated and the accumulated charge of the photodiode 1102 is transferred to the FDN 1104 by activating the transfer transistor 1106 for a predetermined transfer period. During the predetermined transfer period, the voltage at the output $V_{out}$ is monitored. As the charge is transferred, the voltage at the output $V_{out}$ varies, typically decreasing. After the predetermined transfer period, the change in the voltage observed at the output $V_{out}$ is proportional to the intensity of light recorded at the photodiode 1102.

Figure 12:
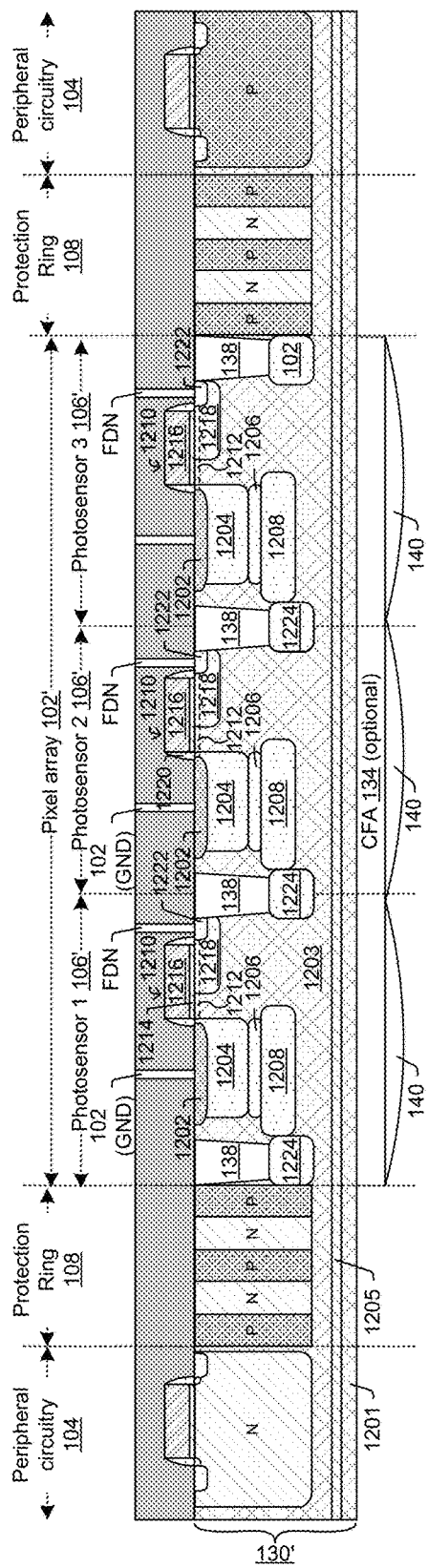
FIG. 12 illustrates a cross-sectional view of an image sensor that includes a number of monochromatic photosensors in accordance with some embodiments.

With reference to FIG. 12, a cross-sectional view of some embodiments of a more detailed image sensor 1200 which includes a photodiode such as described with regards to FIG. 11. The image sensor 1200 is arranged over and/or within a semiconductor substrate 130'. The semiconductor substrate 130' is illustrated as an SOI substrate, which includes a handle substrate 1201, a device layer 1203, and an insulating layer 1205. The handle substrate 1201 is often thinned down and is often made of silicon, and the device layer 1203 is often epitaxially grown and made of silicon. In other embodiments, the handle substrate 1201 and/or device layer 1203 could comprise germanium, or group III and group V elements. The insulating layer 1205 is or otherwise includes, for example, a dielectric, such as silicon nitride, silicon dioxide, or silicon oxynitride and separates the handle substrate 1201 and device layer 1203 from one another.

Multiple individual photosensors 106', which can manifest as photodiodes, are arranged to establish a pixel sensor array 102'. The photosensors 106' are isolated from each other by an array isolation structure 138. The array isolation structure 138 serves to prevent the leakage of charge and/or cross talk between the photosensors 106, and may manifest as a shallow trench isolation (STI) region or a deep trench isolation (DTI) region made up of dielectric material.

In some embodiments, the device layer 1203 is p-type silicon. Thus, within the pixel sensor array 102', each photosensors 106' includes a p-type region 1202 and an n-type region 1204, which meet at a pn junction and make up a photodiode. This p-type region 1202 acts as the anode, and the n-type region 1204 acts as a cathode. Additional deeper n-type regions 1206, 1208 can also be present and provide cathode functionality.

A transfer transistor 1210 is arranged proximate to the n-type region 1204 with a channel region 1212 abutting the n-type region 1204. The channel region 1212 is a region where an inversion channel forms. The transfer transistor 1210 includes a transfer gate dielectric structure 1214 and a transfer gate 1216 arranged over the semiconductor substrate 130'. The transfer gate dielectric structure 1214 is arranged between the semiconductor substrate 130' and the transfer gate 1216 to electrically isolate the transfer gate 1216 from the semiconductor substrate 130'. The transfer gate dielectric structure 1214 and the transfer gate 1216 are respectively, for example, silicon dioxide and polysilicon. In some embodiments, a transfer gate voltage implant region 1218 is arranged in the semiconductor substrate 130' below the transfer gate 1216. The transfer gate voltage implant region 1218 corresponds to a doped region of the semiconductor substrate 130' employed to adjust the threshold voltage. Typically, the transfer gate voltage implant region 1218 has the same doping type as the semiconductor substrate 130'. Disposed on and/or along sidewalls of the transfer gate 1216 and the transfer gate dielectric structure 1214, the transfer transistor 1210 includes a transfer gate sidewall structure 1220. The transfer gate sidewall structure 1220 is, for example, a dielectric, such as, for example, silicon dioxide or silicon nitride.

A floating diffusion node (FDN) 1222 is arranged in the semiconductor substrate 130' abutting the channel region 1212 and on an opposite side of the channel region 1212 as the n-type region 1204. When the transfer transistor 1210 is activated (e.g., by applying a voltage to the transfer gate 1216), an inversion channel is formed in the channel region 1212, thereby allowing accumulated charge to flow from the n-type region 1204 to the FDN 1222. The FDN 1222 is a doped region of the semiconductor substrate 130' having a same doping type as the deeper n-type region 1206, such as, for example, n-type. The FDN 1222 and the n-type region 1204 act as source/drain regions for the transfer transistor 1210.

In some embodiments, a well region 1224 is arranged within the semiconductor substrate 130' and extends under isolation structure 138. The well region 1224 provides isolation for the photodiode and typically has the first doping type with a higher doping concentration than the semiconductor substrate 130'.

Because the photodiodes of the photosensors 106' can be polychromatic sensors that detect a wide range of the electromagnetic spectrum (e.g., are 'color blind'), a color filter array 134 can be arranged in front of such the pixel sensor array 102' to allow the pixel sensor array 102' to assign color tones to each photosensor 106'. In some embodiments, the color filter array 134 is adhered or bonded to the image sensor after the image sensor has been fabricated, and is in that regard an optional element.

Figure 13:
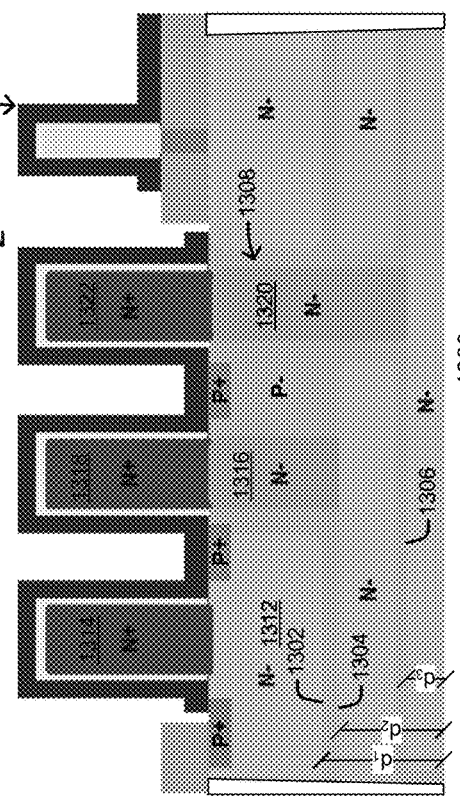
FIG. 13 illustrates a cross-sectional view of a photosensors which is made up of multiple monochromatic detection layers stacked over one another.

In other embodiments, the individual photosensors 106' in the pixel sensor array are "stacked" photosensors that are each capable of differentiating between different colors of light. In such a "stacked" pixel, an individual pixel has different vertical regions that detect different wavelengths of impingent light. For example, stacked photosensors can have a first region at a first depth to detect red light, a second region at a second depth to detect green light, and a third region at a third depth to detect blue light. The first, second, and third depths are different, with the first often being the largest and the third being the smallest. FIG. 13 depicts an example of a pixel 1300 that includes different monochromatic detection layers stacked over one another in accordance with some embodiments. This pixel 1300 includes different photodiodes arranged at different depths from a backside of semiconductor substrate, wherein the different depths correspond to different monochromatic wavelengths to be detected by the various photodiodes. For example, in the illustrated embodiment, a first photodiode junction 1302 is arranged at a first depth, $d_1$, which facilitates detection of red light; a second photodiode junction 1304 is arranged at a second depth, $d_2$, which facilitates detection of green light; and a third photodiode junction 1306 is arranged at a third depth, $d_3$, which facilitates detection of blue light. Columnar N-doped regions 1308 are arranged in the semiconductor substrate to couple the various photodiode junctions to the corresponding fins 1310 on which generated charge is stored. For example, first photodiode junction 1302 has its n-type region 1312 coupled to a first fin 1314; a first columnar N-doped region 1316 extends upward from the second photodiode junction 1304 to a second fin 1318; and a third columnar N-doped region 1320 extends upward from the third photodiode junction to a third fin 1322. A row select transistor 1334 can also be present.

Figure 14:
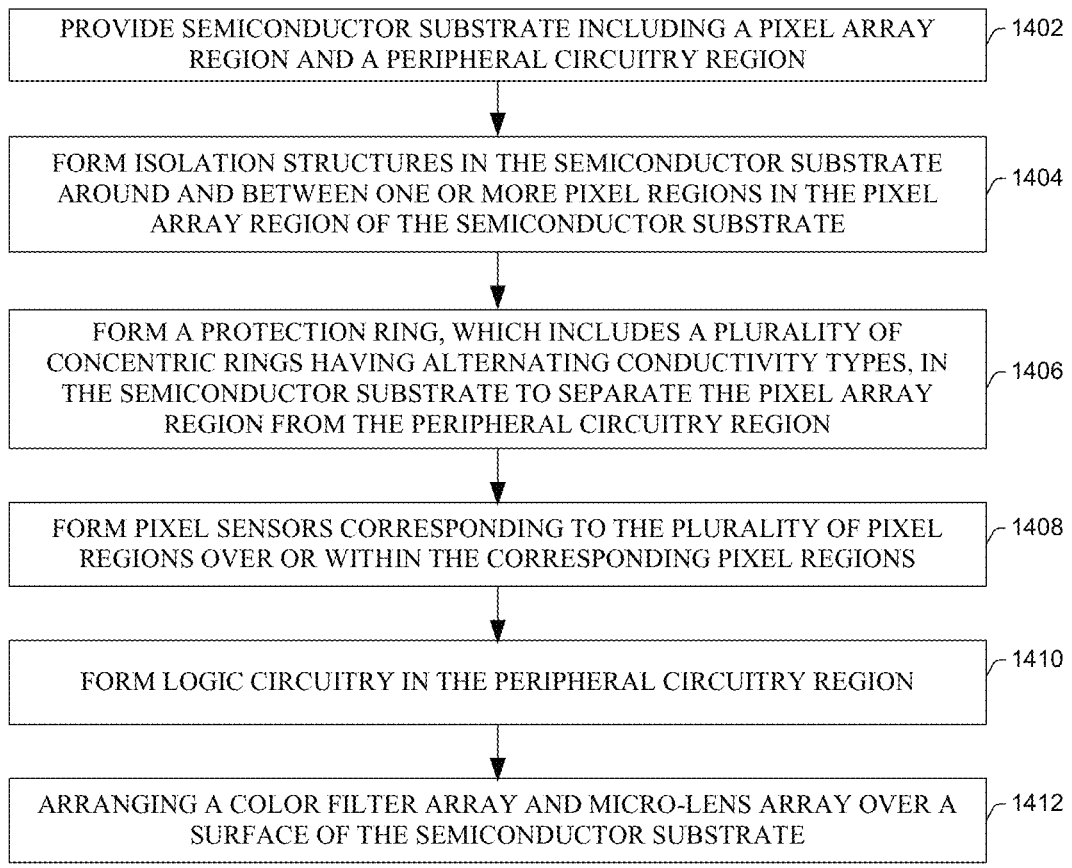
FIG. 14 illustrates a flow chart of some embodiments of methods for manufacturing an image sensor that includes a protection ring separating an image pixel sensor array from periphery circuitry.

With reference to FIG. 14, a flow chart 1400 of some embodiments of a method for manufacturing an image sensor, such as the image sensor of FIG. 1, is provided. While the disclosed methods (e.g., the method illustrated by the flowchart 1400) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In 1402, a semiconductor substrate is provided. The semiconductor substrate includes a pixel sensor array region and a peripheral circuitry region. In 1404, isolation structures are formed in the semiconductor substrate around and between one or more pixel regions in the pixel sensor array region of the semiconductor substrate. In 1406, a protection ring is formed. The protection ring includes a plurality of concentric rings in the semiconductor substrate. The concentric rings have alternating conductivity types and separate the pixel sensor array region from the peripheral circuitry region. In 1408, photosensors corresponding to the plurality of pixel regions are formed over or within the corresponding pixel regions. In 1410, logic circuitry, such as CMOS transistors for example, are formed in the peripheral circuitry region. In 1412, a color filter array and a micro-lens array are arranged over a backside surface of the semiconductor substrate.

In some embodiments, this flow chart 1400 can be advantageous in that dry etching (e.g., reactive ion etching (RIE)) used during formation of the photosensors and/or logic circuitry can cause excess charge to accumulate on gates of the peripheral circuitry or other structures formed on the semiconductor substrate. The protection ring deters pent up charge from releasing in a sudden and intense discharge into the individual photosensors 106, and thus deters catastrophic damage during the manufacturing process.

With reference to FIGS. 15-21, cross-sectional views of some embodiments of the image sensor of FIG. 1 at various stages of manufacture are provided to illustrate some embodiments consistent with the flow chart of FIG. 14. Although FIGS. 15-21 are described in relation to the method, it will be appreciated that the structures disclosed in FIGS. 15-21 are not limited to the method, but instead may stand alone as structures independent of the method. Similarly, although the method of FIG. 14 is described in relation to FIGS. 15-21, it will be appreciated that these cross-sections are merely examples of a method consistent with FIG. 14 and that FIGS. 14's method is not limited to the structures disclosed in FIGS. 15-21.

Figure 15:
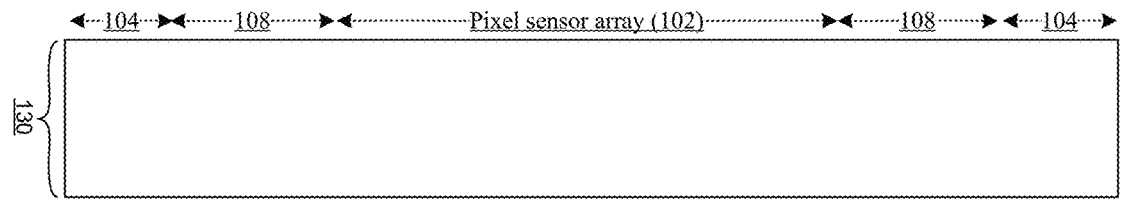
FIGS. 15-21 illustrate a series of cross-sectional views that collectively depict a method of manufacturing an image sensor in accordance with some embodiments.

FIG. 15 illustrates a cross-sectional view 1500 of some embodiments corresponding to Action 1402 of FIG. 14.

As shown by FIG. 15, a semiconductor substrate 130 is provided. The semiconductor substrate 130 includes a pixel sensor array region 102, and a peripheral circuitry region 104, which are spaced apart from one another by a protection ring region 108. The semiconductor substrate 130 is, for example, a bulk substrate of silicon, germanium, or group III and group V elements. Alternatively, the semiconductor substrate 130 is, for example, a semiconductor-on-insulator (SOI) substrate. If present, the SOI substrate includes, for example, a handle substrate and an epitaxially grown device layer stacked vertically on opposing sides of an insulating layer. The handle substrate and device layers are or otherwise include, for example, silicon, germanium, or group III and group V elements. The insulating layer is or otherwise includes, for example, a dielectric, such as silicon nitride, silicon dioxide, or silicon oxynitride. In many instances, the semiconductor substrate 130 manifests as a semiconductor wafer during the manufacturing process, and can have a diameter of 1-inch (25 mm; 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example.

Figure 16:
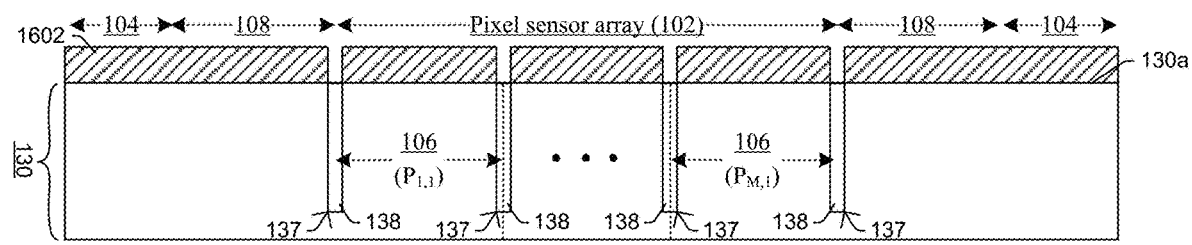

FIG. 16 illustrates a cross-sectional view 1600 of some embodiments corresponding to Action 1404 of FIG. 14.

As shown by FIG. 16, a first mask 1602 is formed over an upper substrate surface 130a of the semiconductor substrate 130, and a first etch is performed with the first mask 1602 in place to form a series of trenches 137 around and between one or more photosensor regions 106. The first mask 1602 can be a photoresist layer and/or a hardmask layer. The trenches 137 are, for example, at least about 0.15 micrometers, such as about 0.5-1 micrometers, wide and/or at least about 3 micrometers, such as about 7-10 micrometers, deep. In some embodiments where the semiconductor substrate 130 is an SOI substrate, the first etch can extend through the device layer to the insulating layer. After the trenches have been formed, the trenches can be filled with an isolation material, such as a dielectric material, and the resulting structure can be chemically mechanically polished (i.e., CMPed) to form isolation structures 138 around and between the one or more photosensor regions 106. The first mask 1602 can be removed via this CMP process, or can be removed prior to this CMP process.

Figure 17:
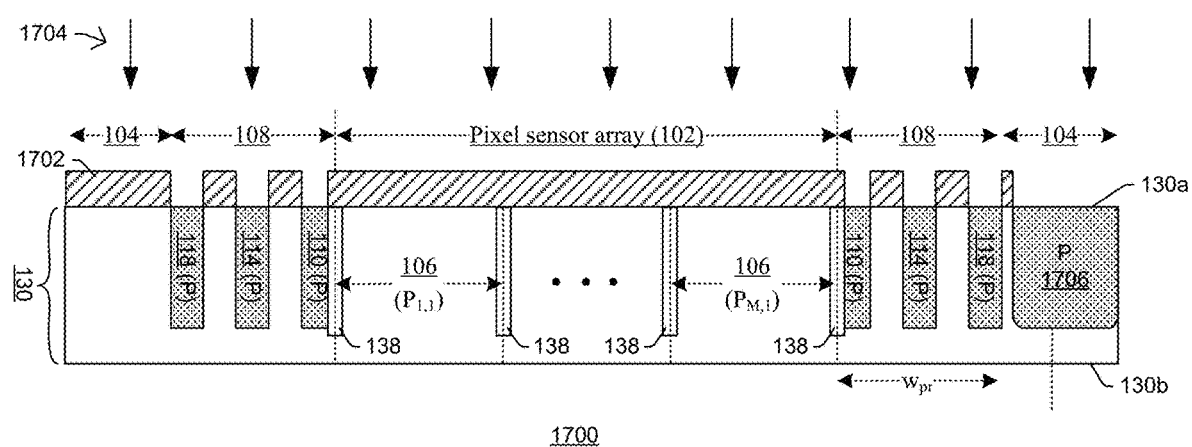
Figure 18:
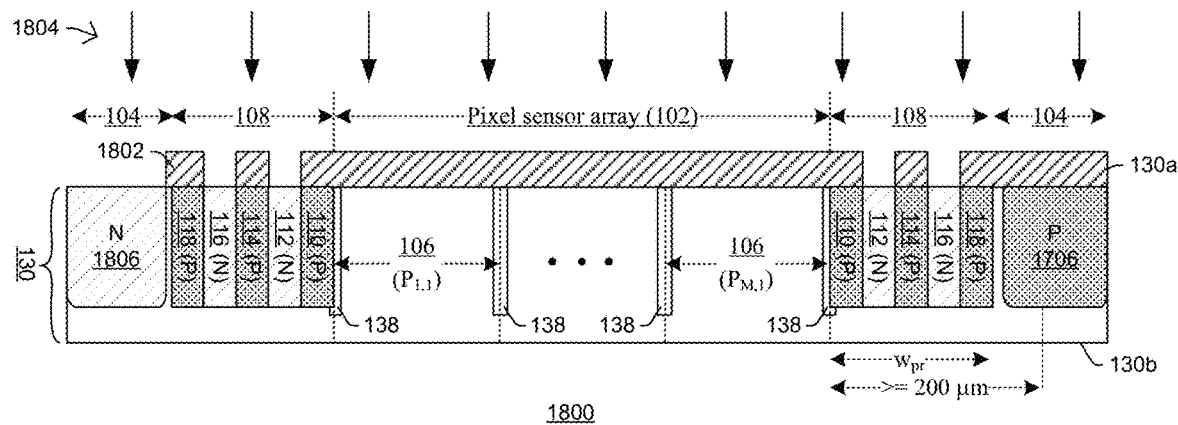

FIGS. 17-18 illustrate cross-sectional views 1700, 1800 of some embodiments corresponding to Action 1406 of FIG. 14. More particularly, FIGS. 17-18 illustration formation of a protection ring made up of multiple concentric rings 110, 112, 114, 116, 118 having alternating conductivity types. Rings 110, 114, 118 of a first conductivity type (e.g., p-type) are formed in FIG. 17, and rings 112, 116 of a second conductivity type (e.g., n-type) are formed in FIG. 18.

In FIG. 17, a second mask 1702 is provided over the semiconductor substrate 130. Ions 1704, which correspond to the first conductivity type (e.g., p-type), are concurrently implanted through openings in the second mask 1702 into both a first region of the peripheral circuitry region 104 and a first subset of the plurality of concentric rings. For example, in the illustrated embodiment of FIG. 17, the ions of the first conductivity type are used to form first, third, and fifth rings 110, 114, 118, respectively; as well as a p-well 1706 in the peripheral circuitry region 104. Because the p-well 1706 is already in place for previous technology nodes, the first, third and fifth rings 110, 114, 118 respectively, can be easily integrated into this previous technology node without the need for additional costly masks. Although FIG. 17 shows an example where the rings 110, 114, and 118 are formed concurrently with p-well 1706, it will be appreciated that in other embodiments the rings 110, 114, 118 could be formed concurrently with other p-type structures in the peripheral circuitry and/or pixel sensor array 102. For example, the rings could be formed concurrently with an anode region of a photodiode, p-type isolation regions, p-type source/drain regions, p-type Vt implant regions, p-type well regions or other implanted regions to limit the overall number of masks used in the process.

In FIG. 18, a third mask 1802 is provided over the semiconductor substrate 130. Ions 1804, which correspond to the second conductivity type (e.g., n-type), are concurrently implanted through openings in the third mask into both a second region of the peripheral circuitry region 104 and a second subset of the plurality of concentric rings. For example, in the illustrated embodiment of FIG. 18, the ions of the second conductivity type are used to form second and fourth rings 112, 116; as well as an n-well 1806 in the peripheral circuitry region 104. Because the n-well 1806 is already in place for previous technology nodes, the second and fourth rings 112, 116 can be easily integrated into this previous technology node without the need for additional costly masks. Although FIG. 18 shows an example where the rings 112, 116 are formed concurrently with an n-well 1806, it will be appreciated that in other embodiments the rings 112, 116 could be formed concurrently with other n-type structures in the peripheral circuitry and/or pixel sensor array. For example, the rings could be formed with a cathode region of a photodiode, n-type isolation regions, n-type source/drain regions, n-type Vt implant regions, n-well regions or other implanted regions to limit the overall number of masks used in the process.

Figure 19:
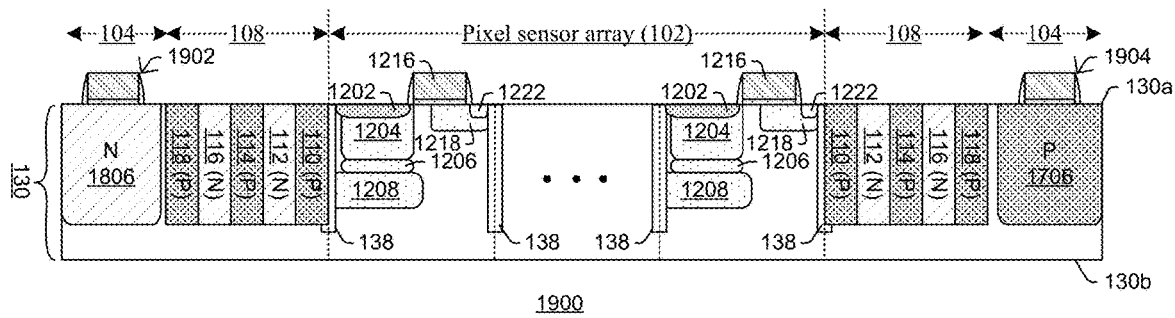

FIG. 19 illustrates cross-sectional view 1900 of some embodiments corresponding to Action 1408-1410 of FIG. 14.

As shown by FIG. 19, photosensors are formed in corresponding pixel region within the pixel sensor array 102. Typically, there is a one-to-one correspondence between the photosensors and the pixel regions. The photosensors are formed by selectively implanting n- or p-type dopants into the semiconductor substrate 130 and forming transistor gates 1216 over the semiconductor substrate 130. Logic circuitry, such as a p-type CMOS transistor 1902 and an n-type CMOS transistor 1904 for example, are formed in the peripheral circuitry region 104.

Figure 20:
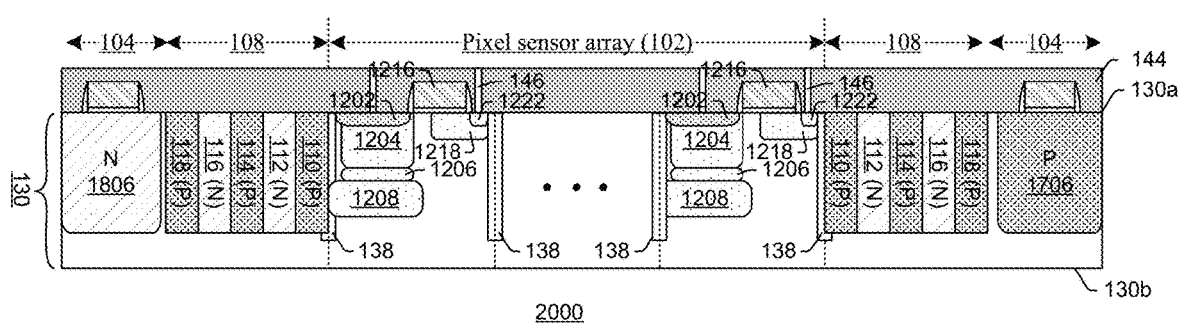

As shown by FIG. 20, an ILD layer 144 is formed over the upper substrate surface 130a and the photosensors. The ILD layer 144 is or otherwise includes, for example, silicon dioxide, a low-κ dielectric, or an extreme low-κ dielectric. Contacts 146 are formed through the ILD layer 144 to the pixel sensors. The contacts 146 are or otherwise include, for example, a metal, such as copper or tungsten. Additional alternating metal and insulating layers (e.g., metal 1 (M1), ILD1, metal 2 (M2), ILD2, and so on are then formed to build up interconnect layer, wherein vias extend vertically between neighboring metal layers, to implement cross-sectional view 2000 which can correspond to, for example, the circuit of FIG. 11.

Figure 21:
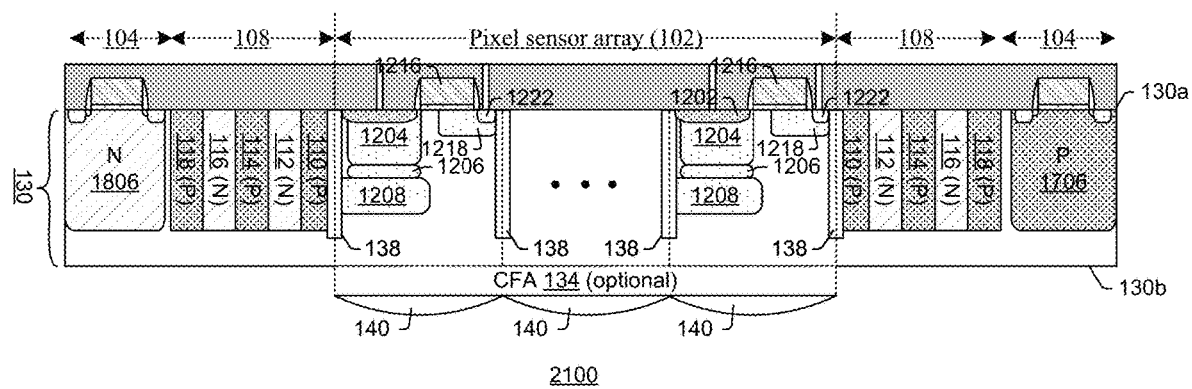

FIG. 21 illustrates cross-sectional view 2100 of some embodiments corresponding to Action 1412 of FIG. 14.

As shown by FIG. 21, a color filter array 134 can be formed over a backside surface of the semiconductor substrate. In some embodiments, the color filter array 134 is manufactured separately and adhered to the backside surface of semiconductor substrate 130 after the substrate has been diced into individual die; however in other embodiments the color filter array is adhered to the semiconductor substrate 130 at the wafer level. A micro-lens array 140 can also be adhered to a backside surface of the color filter array 134. It will be appreciated that identifiers such as "first" and "second" do not imply any type of ordering, placement, or temporal relationship with respect to other elements; but rather "first" and "second" and other similar identifiers are just generic identifiers and these elements can be swapped or permuted in other implementations. For example, "a first layer" described in connection with a first figure may not necessarily corresponding to a "first layer" described in connection with another figure or un-illustrated embodiment, and may in fact correspond to a "second layer" in another embodiment.

Thus, as can be appreciated from above, the present disclosure provides an image sensor. The image sensor includes a pixel sensor array including a plurality of photosensors arranged in a semiconductor substrate. Peripheral circuitry is arranged in or on the semiconductor substrate and is spaced apart from the pixel sensor array. A protection ring circumscribes an outer perimeter of the pixel sensor array and separates the pixel sensor array from the peripheral circuitry. The protection ring has an annular width of greater than 20 microns. The protection ring includes a first ring in the substrate neighboring the pixel sensor array, a second ring circumscribing the first ring and meeting the first ring at a first p-n junction, and a third ring circumscribing the second ring and meeting the second ring at a second p-n junction.

Other embodiments relate to a method of forming an image sensor. In this method, a semiconductor substrate is provided and includes a pixel sensor array region and a peripheral circuitry region. A first mask is provided over the semiconductor substrate. The first mask has a first peripheral opening over the peripheral circuitry region and has a first set of ring-like openings surrounding the pixel sensor array. Ions corresponding to a first conductivity type are concurrently implanted through the first peripheral opening to form a first doped region in the peripheral circuitry region and through the first set of ring-like openings to form a first plurality of concentric rings separating the pixel sensor array from the peripheral circuitry region. A second mask is provided over the semiconductor substrate. The second mask has a second peripheral opening, which is different from the first peripheral opening, over the peripheral circuitry region and has a second set of ring-like openings surrounding the pixel sensor array. Ions corresponding to a second conductivity type are concurrently implanted through the second peripheral opening to form a second doped region in the peripheral circuitry region and through the second set of ring-like openings to form a second plurality of concentric rings which are interspersed with the first plurality of concentric rings to separate the pixel sensor array from the peripheral circuitry region.

Still other embodiments relate to a device including an array of semiconductor photosensors arranged in or on a semiconductor substrate. In this device, peripheral circuitry is arranged in or on the semiconductor substrate and is spaced apart from the array of photosensors. A protection ring circumscribes an outer perimeter of the array and separates the array from the peripheral circuitry. The protection ring includes a first p-type ring in the substrate neighboring the array. A second n-type ring circumscribes the first ring and meets the first ring at a first p-n junction. A third p-type ring circumscribes the second ring and meets the second ring at a second p-n junction. A fourth n-type ring circumscribes the third ring and meets the third ring at a third p-n junction. A fifth p-type ring circumscribes the fourth ring and meets the fourth ring at a fourth p-n junction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   an array of semiconductor devices arranged in or on a semiconductor substrate, the array of semiconductor devices including a plurality of semiconductor devices which are arranged in multiple columns and multiple rows;
   an isolation structure comprising dielectric material disposed in the semiconductor substrate and laterally surrounding the array; and
   a protection ring circumscribing an outer perimeter of the array and circumscribing the isolation structure; the protection ring including a first ring of a first conductivity type in the semiconductor substrate and neighboring the array, a second ring of a second conductivity type circumscribing the first ring and meeting the first ring at a first p-n junction, and a third ring of the first conductivity type circumscribing the second ring and meeting the second ring at a second p-n junction; and wherein a bottom surface of the isolation structure extends to a depth in the semiconductor substrate that is deeper than a lowermost portion of the protection ring.

2. The device of claim 1, wherein the first ring has a first width, and the second ring has a second width greater than the first width.

3. The device of claim 2, wherein the second width is at least approximately three times larger than the first width.

4. The device of claim 1, wherein the protection ring further includes a fourth ring circumscribing the third ring and meeting the third ring at a third p-n junction.

5. The device of claim 4, wherein the first ring is p-type, the second ring is n-type, the third ring is p-type, and the fourth ring is n-type.

6. The device of claim 4, wherein the fourth ring has a fourth width as measured from the third p-n junction to an outermost extent of the fourth ring, wherein the fourth width is greater than a second width of the second ring.

7. The device of claim 4, wherein a first width of the first ring and a third width of the third ring are at least substantially equal.

8. The device of claim 4, wherein the protection ring further includes a fifth ring circumscribing the fourth ring and meeting the fourth ring at a fourth p-n junction.

9. The device of claim 8, wherein the first ring is p-type, the second ring is n-type, the third ring is p-type, the fourth ring is n-type, and the fifth ring is p-type.

10. The device of claim 8, wherein the fourth ring has a fourth width as measured from the third p-n junction to the fourth p-n junction, wherein the fourth width is greater than a second width of the second ring.

11. The device of claim 1,
wherein the bottom surface of the isolation structure is approximately the same depth as a lowermost portion of the protection ring.

12. The device of claim 11, wherein the bottom surface of the isolation structure corresponds to a well region, and the bottom surface of the well region is located at approximately the same depth as the lowermost portion of the protection ring.

13. The device of claim 12, wherein the isolation structure is configured to laterally separate semiconductor devices of neighboring columns from one another and configured to laterally separate semiconductor devices of neighboring rows from one another.

14. The device of claim 1, wherein the first ring has an inner sidewall in direct contact with an outer sidewall of the dielectric material of the isolation structure.

15. The device of claim 1, wherein the first ring, the second ring, and the third ring have widths that range from 10 nm to approximately 1000 μm.

16. The device of claim 1, wherein the first ring, the second ring, and the third ring have widths that are equal to one another.

17. The device of claim 1, wherein the first ring exhibits a p-type dopant concentration ranging from approximately $1*10^{11}/cm^3$ to approximately $1*10^{13}/cm^3$; the second ring exhibits an n-type dopant concentration ranging from approximately $1*10^{11}/m^3$ to approximately $1*10^{13}/cm^3$; and the third ring exhibits a p-type dopant concentration ranging from approximately $1*10^{11}/m^3$ to approximately $1*10^{13}/cm^3$.

18. A device, comprising:
an array of semiconductor devices arranged in or on a semiconductor substrate, the array of semiconductor devices including a plurality of semiconductor devices which are arranged in multiple columns and multiple rows;
an isolation structure comprising dielectric material disposed in the semiconductor substrate and laterally surrounding the array;
a color filter array comprising a plurality of color filter elements arranged on a face of the semiconductor substrate; and
a protection ring including a plurality of concentric rings circumscribing an outer perimeter of the array of semiconductor devices and circumscribing an outer perimeter of the color filter array; the protection ring including a first, innermost ring of a first conductivity type in the semiconductor substrate and neighboring the array, a second ring of a second conductivity type circumscribing the first, innermost ring and meeting the first, innermost ring at a first p-n junction, and a third ring of the first conductivity type circumscribing the second ring and meeting the second ring at a second p-n junction;
wherein the first, innermost ring has an inner sidewall in direct contact with an outer sidewall of the dielectric material of the isolation structure; and
wherein a bottom surface of the isolation structure extends to a depth in the semiconductor substrate that is deeper than a lowermost portion of the first, innermost ring, is deeper than a lowermost portion of the second ring, and is deeper than a lowermost portion of the third ring.

19. A device, comprising:
a semiconductor substrate having a first face and a second face, the second face being opposite the first face;
an array of pixels disposed in the semiconductor substrate, the array of pixels including a plurality of pixel regions which are arranged in multiple columns and multiple rows, wherein a pixel region of the plurality of pixel regions comprises:
an isolation structure disposed in the semiconductor substrate and laterally surrounding the pixel region;
a p-type anode region disposed in the pixel region of the semiconductor substrate, and disposed near the first face of the semiconductor substrate; and
an n-type cathode region disposed in the pixel region of the semiconductor substrate and meeting the p-type anode region at a photodiode junction; and
a protection ring circumscribing an outer perimeter of the array of pixels;
the protection ring including a first ring of a first conductivity type in the semiconductor substrate and neighboring the array, a second ring of a second conductivity type circumscribing the first ring and meeting the first ring at a first p-n junction, a third ring of the first conductivity type circumscribing the second ring and meeting the second ring at a second p-n junction;
wherein the first ring of the protection ring has an inner sidewall in direct contact with an outer sidewall of dielectric material of the isolation structure; and
wherein a bottom surface of the isolation structure extends to a depth in the semiconductor substrate that is deeper than a lowermost portion of the first ring, is deeper than a lowermost portion of the second ring, and is deeper than a lowermost portion of the third ring.

20. The device of claim 19, wherein the isolation structure is configured to laterally separate pixel regions of neighboring columns from one another and is configured to laterally separate pixel regions of neighboring rows from one another.

* * * * *